(12) United States Patent
Liao et al.

(10) Patent No.: US 6,468,704 B1
(45) Date of Patent: Oct. 22, 2002

(54) METHOD FOR IMPROVED PHOTOMASK ALIGNMENT AFTER EPITAXIAL PROCESS THROUGH 90° ORIENTATION CHANGE

(75) Inventors: Chi-Hung Liao, Sanchung (TW); Yih-Ann Lin, Taipei (TW); Sheng-Liang Pan, Hsinchu (TW); Cheng-Yu Chu, Hsinchu (TW); Kuo-Liang Lu, Hsin-Chu (TW); Yu Hsi Wang, Shenggang Shiang (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 43 days.

(21) Appl. No.: 09/835,027

(22) Filed: Apr. 16, 2001

(51) Int. Cl.$^7$ ................................................. G03F 9/00
(52) U.S. Cl. ......................................................... 430/22
(58) Field of Search ............................................ 430/22

(56) References Cited

U.S. PATENT DOCUMENTS

| | | | |
|---|---|---|---|
| 4,534,804 A | 8/1985 | Cade | 148/1.5 |
| 4,889,832 A | 12/1989 | Chatterjee | 437/203 |
| 5,017,512 A | 5/1991 | Takagi | 437/227 |
| 5,939,132 A | 8/1999 | Fujii et al. | 427/97 |

*Primary Examiner*—Christopher G. Young
(74) *Attorney, Agent, or Firm*—George O. Saile; Stephen B. Ackerman

(57) ABSTRACT

A method for alignment to an alignment mark array within a patterned electronic material layer, formed on a substrate employed in a microelectronics fabrication, with improved registration accuracy of a subsequent step-and-repeat photomask pattern. There is first provided a substrate upon which is formed a patterned microelectronics layer containing an alignment mark array. There is then formed over the substrate and patterned layer, covering over the alignment marks, a subsequent layer or layers which may be of opaque material. In order to align properly a patterned photomask for patterning the overlying layer by means of conventional photolithography, the alignment mark array is located by first scanning with a laser light source contained within a step-and-repeat apparatus containing the patterned photomask and detecting the optical radiation signal scattered from the alignment mark array. The accuracy of location may be enhanced by rotating the orientation of the alignment mark array with respect to the direction of scanning with the laser light source by 90 degrees to render the subsequent orientation orthogonal to the first orientation, and then repeating the scanning operation. The altered nature of the back-scattered light signal from the orthogonal scanning direction provides additional information for improving the precision of location and alignment.

16 Claims, 2 Drawing Sheets

METHOD FOR IMPROVED PHOTOMASK ALIGNMENT AFTER EPITAXIAL PROCESS THROUGH 90° ORIENTATION CHANGE

BACKGROUND OF THE INVENTION

1. Field of the Invention

The invention relates to the field of microelectronics fabrication. More specifically, the invention relates to the field of photo fabrication of integrated circuit microelectronics fabrications.

2. Description of the Related Art

Modern electronics circuits are commonly fabricated employing substrates upon which multiple layers of conductor, insulator and specialized materials are sequentially formed into patterns which make up the component elements of the circuits. In the fabrication of microelectronics circuitry, the intimate integration of multiple patterned layers and the semiconductor substrate have led to the generic term "integrated circuit" to describe this class of electronic devices. The fabrication of these semiconductor integrated circuit microelectronics devices has been driven to develop methods of increasingly more accurate control of increasingly finer pattern dimensions in order to produce higher circuit density and reduce the cost per circuit. The greater complexity of the resulting high density circuit designs has required that a sophisticated photofabrication technology be developed which employs the use of patterned photomask stencils to provide the necessary pattern images in photosensitive surface layers formed over the various multiple layers of the integrated circuit device. These patterned layers, after development of the images produced therein by exposure to the photomasks, allow the replication of the patterns in the surface layers by methods such as subtractive etching, selective deposition and so forth. The repetitive employment of such pattern formation methods on the multiple layers forms the complex multi-layer structures comprising such integrated circuit fabrications to be manufactured on the semiconductor substrate.

The repetition of photomask exposure, photoresist development, and fabrication steps places a stringent requirement on the precise alignment of each succeeding photomask to the previously fabricated patterned surface layers. The alignment is conventionally accomplished by providing alignment marks within each pattern so that each photomask pattern may be aligned to the alignment marks of previously fabricated patterns on the semiconductor substrate. Modern photolithographic methods generally employ step-and-repeat methods to project a photomask pattern onto an integrated circuit substrate after the alignment marks already present in the existing patterns are located. The alignment marks are located by scanning with a laser light source and detecting the back-scattered light from the alignment marks. While the methods of generating and detecting alignment marks on photolithographic patterns currently employed within microelectronics integrated circuit fabrications are generally satisfactory, these current methods are not without problems.

For example, it is often necessary to deposit a blanket layer over the surface of the substrate which is then required to be coated with a photoresist layer and then exposed to the desired photomask pattern to fashion the appropriate pattern from the blanket layer. If the blanket layer is opaque to the radiation normally employed to scan for the alignment marks, the alignment marks may be difficult or impossible to detect with sufficient accuracy. For example, a commonly employed opaque material layer in microelectronics fabrications is epitaxial silicon, often formed to a thickness of several micrometers to increase collector thickness and increase collector breakdown voltage performance. Since this thickness is often many times the thickness of the underlying alignment marks, it becomes difficult or impossible to replicate the distinctness of the alignment mark edge features in the thicker overlying silicon layer. This is shown, for example, in FIG. 1, wherein the alignment mark 11 formed within a layer 12 on the substrate 10 is covered by an overlayer 14. This difficulty can be overcome by providing an additional photomasking operation to remove the opaque layer selectively from the alignment mark area, but this requires additional photolithographic masking and processing, which is costly.

An alignment mark or marks may be scanned by laser radiation to provide an alignment reference by employing the detection of the back-scattered laser radiation from the alignment marks, as shown in FIG. 2. However, the amount of back-scattered radiation 24 from a particular series of alignment marks such as the line of alignment marks 20 after coverage by a layer 22 as shown in FIG. 2 may not contain sufficient information to provide the alignment accuracy desired.

It is therefore towards the goal of providing an improved method for alignment of photomask patterns with alignment marks covered by opaque surface layers employed within microelectronics fabrications that the present invention is directed.

Various methods have been disclosed for alignment of alignment marks covered over by opaque surface layers employed within microelectronics fabrications.

For example, Cade, in U.S. Pat. No. 4,534,804, discloses a method for forming alignment marks within a silicon substrate which are visible on the surface of the substrate. The method employs a laser beam to be absorbed within a heavily doped interior region of a silicon substrate after passing through a more lightly doped surface layer. Subsequently the defects formed therein by the absorbed laser energy are caused to migrate to the surface by heating the substrate, whereby the region of absorption is rendered visible at the surface.

Further, Chatterjee, in U.S. Pat. No. 4,889,832, discloses a method for forming alignment marks on a silicon substrate which are visible from the backside of the substrate. The method employs selective subtractive etching away of the substrate layer to an etch stop layer until the remaining layer is sufficiently thin that the alignment marks on the front side of the substrate are visible and may be used for alignment purposes for pattern formation of layers on the backside of the substrate.

Still further, Takagi, in U.S. Pat. No. 5,017,512, discloses a method for forming a layer over a conductor layer on a semiconductor substrate which improves the efficiency of dicing the substrate into separate integrated circuit dies including the test site and alignment mark die locations. The layer is silicon nitride, which is harder than the underlying conductor layer and prevents fouling of the dicing saw by the softer conductor metal layer material.

Finally, Fujii et al., in U.S. Pat. No. 5,939,132, disclose a method for blanket metallization of a silicon substrate wafer with alignment marks on the periphery of individual circuit die patterns while avoiding covering over the alignment marks. The method employs peripheral substrate holders which cover over the peripheral alignment mark regions and prevent them from being covered over by metal when the substrate is metallized to fill in contact holes and provide the basis for interconnection conductor patterning, Desirable in the art of microelectronics fabrication are additional methods for improved alignment of subsequent photomask patterns after deposition of opaque surface layers over existing alignment marks.

It is towards this goal that the present invention is generally and specifically directed.

SUMMARY OF THE INVENTION

A first object of the present invention is to provide a method for employing an alignment mark array, within a pattern formed upon a substrate employed within an electronics fabrication, with improved alignment capability to a subsequent photomask pattern employed in photolithographic pattern formation of an overlying material layer formed over the same substrate.

A second object of the present invention is to provide a method in accord with the first object of the present invention where the alignment of the photomask pattern by step-and-repeat method to the alignment mark array may be performed when the surface layer formed overlying the alignment mark array is opaque to the scanning radiation employed.

A third object of the present invention is to provide a method in accord with the first object of the present invention and the second object of the present invention, where the accuracy of the alignment of the photomask pattern of the opaque layer overlying the alignment mark array is enhanced.

A fourth object of the present invention is to provide a method in accord with the first object of the present invention, the second object of the present invention, and/or the third object of the present invention, where the method is readily commercially implemented.

In accord with the objects of the present invention, there is provided a method for alignment to an array of alignment marks, within a patterned microelectronic layer formed upon a substrate employed within an electronics fabrication, of a subsequent step-and-repeat photomask pattern to be formed within an overlying layer of material upon the substrate with improved registration. To practice the method of the present invention, there is provided a substrate upon which there is formed a layer or layers of microelectronic material in a pattern, the pattern containing an array of alignment marks. There is formed over the substrate and patterned layer an overlying layer of microelectronic material which covers the alignment marks and which may be opaque. In order to align properly a photomask pattern for patterning the overlying layer by means of conventional photolithography, the alignment marks are located by first scanning with a laser light source contained within a step-and-repeat apparatus containing the patterned photomask and detecting the back-scattered optical radiation from the alignment mark array. The accuracy of the location may be enhanced by rotating the orientation of the alignment mark array with respect to the direction of scanning with the laser light source by 90 degrees to render it orthogonal to the first orientation of the alignment mark array and the laser step-and-repeat scan and then repeating the scanning operation. The altered nature of the back-scattered radiation signal from the orthogonally altered scanning direction provides additional information for improving the precision of location and alignment of the photomask pattern to the alignment mark array.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein:

FIG. 3 is a schematic cross-sectional drawing illustrating the formation of alignment marks covered by an overlayer of material whose thickness is greater than the depth of the alignment marks. FIG. 4 illustrates the method of the present invention of scanning an array of alignment marks by a laser step-and-repeat apparatus for alignment of a photomask to a pattern containing said alignment marks already formed on the substrate. FIG. 5 illustrates the method of the present invention of employing orthogonal change of orientation of the alignment mark array with respect to the scanning direction of the laser step-and-repeat apparatus to improve the alignment accuracy.

DESCRIPTION OF THE PREFERRED EMBODIMENT

The present invention provides a method for alignment to an alignment mark array within a patterned layer of microelectronic material, formed upon a substrate employed within a microelectronics fabrication, of a subsequent photomask pattern in an overlying layer of electronic material, with improved accuracy of alignment and registration employing a step-and-repeat photolithographic pattern formation method.

Although the method of the present invention is most likely of value when employed in pattern formation within layers of microelectronic material formed upon substrates employed within electronic circuitry, the method of the present invention is of value when employed in pattern formation of layers of microelectronics conductor, semiconductor and dielectric materials formed upon semiconductor substrates employed within microelectronics fabrications including but not limited to integrated circuit microelectronics fabrications, solar cell microelectronics fabrications, charge coupled device array microelectronics fabrications, ceramic substrate microelectronics fabrications, optoelectronics fabrications and flat panel display microelectronics fabrications.

Figure 3:
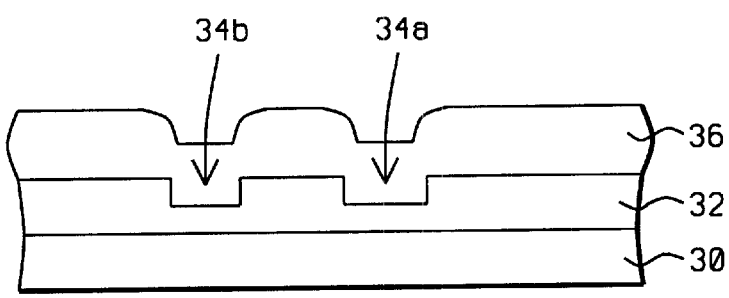
FIG. 3, FIG. 4 and FIG. 5 are directed toward a general embodiment of the present invention.

Referring now to FIG. 3, there is shown a schematic cross-sectional diagram illustrating the formation of an alignment mark array within a pattern of microelectronic material over which is formed a blanket layer which may be opaque, in accord with the method of the present invention. Shown in FIG. 3 is a substrate 30 over which is formed a patterned layer of microelectronics material 32 in which are formed alignment mark array features 34a, 34b and 34c. Formed over the substrate and microelectronics layer is a subsequent blanket layer 36.

Figure 1:
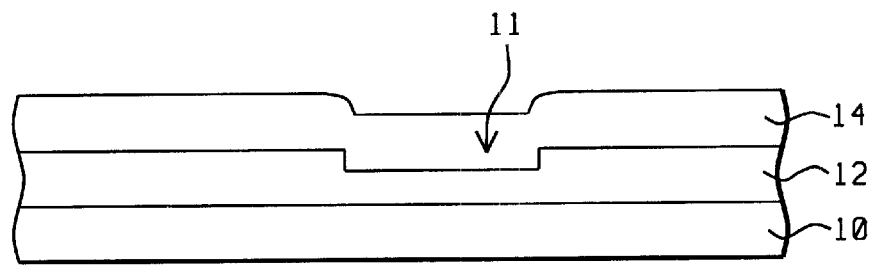
FIGS. 1 and 2 are descriptive of the prior art.
Figure 2:
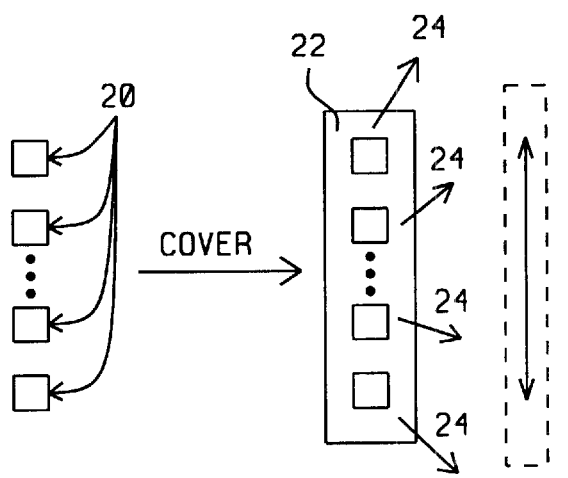

With respect to the substrate 30 shown in FIG. 1, the substrate 30 is chosen from substrate materials including but not limited to microelectronics conductor materials, microelectronics semiconductor materials and microelectronics dielectric materials. The substrate 30 may be the substrate itself or a layer of material formed over the substrate. The substrate 30 may be employed within a microelectronics fabrication including but not limited to integrated circuit microelectronics fabrications, charge coupled device microelectronics fabrications, solar cell microelectronics fabrications, optoelectronics microelectronics fabrications, ceramic substrate microelectronics fabrications and flat panel display microelectronics fabrications. Preferably the substrate 30 is a semiconductor substrate.

With respect to the patterned microelectronics layer 32 shown in FIG. 3, the patterned microelectronics layer 32 may be formed from microelectronics materials including but not limited to microelectronics conductor materials, microelectronics semiconductor materials and microelectronics dielectric materials. Preferably the patterned microelectronics layer 32 is formed from silicon oxide dielectric material employing methods as are well known in the art of microelectronics fabrication.

With respect to the alignment mark array features 34a, 34b and 34c shown in FIG. 3, the alignment mark array features 34a, 34b and 34c are formed employing methods and materials which are conventional in the art of microelectronics fabrications. Preferably the alignment mark array features 34a, 34b and 34c are etched into silicon oxide to a depth of from about 1000 angstroms to about 1500 angstroms, employing methods and materials which are known in the art of microelectronics fabrication.

With respect to the overlying blanket layer 36 shown in FIG. 3, the overlying blanket layer 36 may be formed from microelectronics materials including but not limited to microelectronics conductor materials, microelectronics semiconductor materials and microelectronics dielectric materials employing methods as are known in the art of microelectronics fabrication. The overlying blanket layer 36 may be formed of a material opaque to radiation. Preferably the overlying blanket layer 36 is a layer of silicon formed epitaxially over the substrate 30, patterned microelectronics layer 32 and alignment mark array features 34a, 34b and 34c to a thickness of from about 9 to about 95 micrometers.

The present invention provides a method for alignment of an alignment mark array, formed within a patterned layer formed upon a substrate, with increased accuracy to a subsequent photomask pattern to be formed within an overlying layer formed over the alignment mark array, which overlying layer may be opaque.

Figure 4:
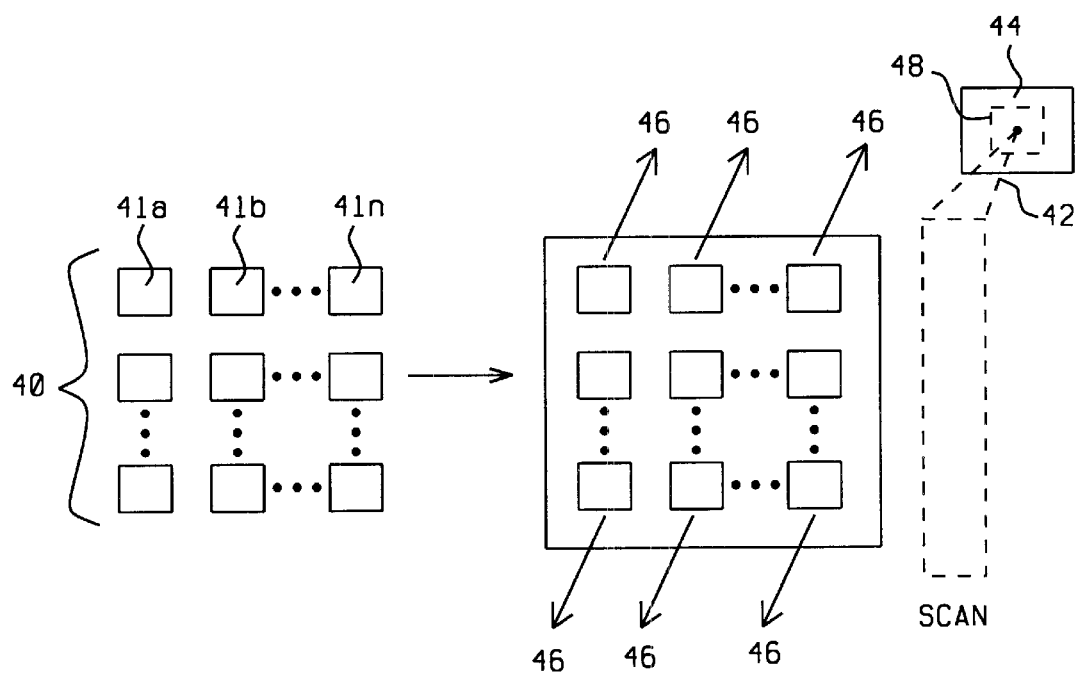

Referring now more particularly to FIG. 4, there is shown a schematic diagram illustrating a rectilinear array of alignment mark features in accord with the present invention. Shown in FIG. 4 is a multiple array 40 of individual alignment mark features 41a,b, . . . arranged in rows and columns to form a rectilinear array within the boundaries of a die in a pattern of microelectronics circuit dies, which boundary constitutes the kerf region where the individual dies are to be physically separated. The alignment mark array 40 is capable of being scanned by a beam of laser radiation 42 emitted by a step-and-repeat system 44 equipped for detecting the back-scattered laser radiation 46 from the alignment marks and positioning a photomask pattern 48 to be aligned with the alignment mark array 40 and accurately registered to the underlying microelectronics pattern of which the alignment mark array 40 is an integral part.

With respect to the alignment mark array 40 shown in FIG. 4, the alignment mark array 40 has the individual alignment mark features 41a, b, . . . arranged with a spacing or pitch between rows and columns selected to provide the optimum degree of back-scattering of the laser radiation beam. Preferably the spacing between rows is from about 20 to about 26 micrometers, and the spacing between columns is from about 20 to about 26 micrometers. With respect to the dimensions of a particular individual alignment mark feature 41a, the size of an individual alignment mark feature is to be consistent with the array dimensions and of any reasonable geometric or regular shape. Preferably, an individual alignment mark feature is about 4 micrometers by about 4 micrometers of rectangular or square aspect.

With respect to the laser scanning step and repeat system 40 shown in FIG. 4, the laser scanning step and repeat system 40 may be of any conventional type as are well known in the art of microelectronics fabrication.

The rectilinear array of alignment mark features 40 shown in FIG. 4 may be rectangular or square in design. Preferably the array 40 is designed to fit within a die area on the semiconductor substrate surface. This area is generally of suitable size and shape form factor for a microelectronics circuit pattern, which will then accommodate a rectilinear array of alignment mark features containing at least two rows and/or two columns. An optimum array design in a square die area is a square array.

Figure 5:
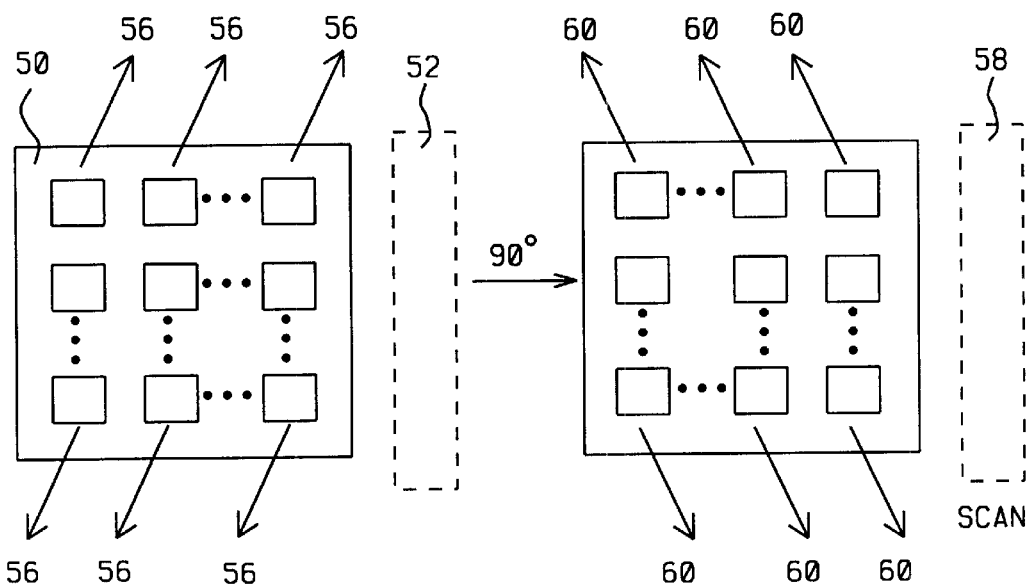

Referring now more particularly to FIG. 5, there is shown a schematic diagram illustrating the orthogonal rotation of the alignment mark array between scanning operations in accordance with the method of the present invention. The rectilinear alignment mark array 50 is equivalent to the rectilinear alignment mark array 40 shown in FIG. 4. The scanning direction 52 of the laser beam 52 is first performed in a particular direction 54 with respect to the alignment mark array 50 and the back-scattered radiation signal 56 detected to provide an alignment reference. The direction of the scan is then rotated by 90 degrees to an orthogonal direction 58 with respect to the first scanning direction, and the scanning operation repeated to provide additional back-scattered radiation signal 60 to permit increased alignment accuracy of registration between the alignment mark array and the photomask pattern within the step-and-repeat scanning system.

The method of the present invention provides an improved accuracy of alignment between the alignment mark array of a microelectronics patterned layer or layers present on the surface of a substrate employed within a microelectronics fabrication and a subsequent pattern to be formed within an overlying microelectronics layer formed over the substrate and patterned microelectronics layer or layers. The method is particularly suited to alignment of an opaque layer overlying the previously formed patterned layers.

As is understood by a person skilled in the art, the preferred embodiment of the present invention is illustrative of the present invention rather than limiting of the present invention. Revisions and modifications may be made to methods, materials, structures and dimensions through which may be formed microelectronics fabrications and semiconductor integrated circuit microelectronics fabrications without departing from the scope and spirit of the present invention.

What is claimed is:

1. A method for alignment to an alignment mark array, within a patterned layer formed upon a substrate, of a subsequent step-and-repeat photomask pattern comprising:
   providing a substrate;
   forming upon the substrate a patterned layer having therein an array of alignment marks;
   forming over the patterned layer and alignment mark array a subsequent layer or layers;
   aligning the alignment mark array of the underlying patterned layer to a photomask pattern employing a scanning method further comprising:
   scanning the alignment mark array in a first direction employing a step-and-repeat laser scanning system;

changing the orientation of the alignment mark array 90 degrees orthogonally with respect to the first scanning direction; and performing subsequent scanning with the step-and-repeat system to align the photomask pattern to the underlying alignment mark array with enhanced accuracy.

2. The method of claim 1 wherein said subsequent material layer or layers are formed of opaque material.

3. The method of claim 1 wherein the alignment mark array is a rectilinear array containing at least two rows and at least two columns of alignment mark features.

4. The method of claim 3 wherein the rectilinear array is a square or rectangular array of equally spaced alignment mark features of overall dimensions suitable to fit within the die space allotted within the photomask pattern for alignment marks.

5. The method of claim 4 wherein the said rectilinear array alignment mark features are arranged in rows and columns whose pitch is from about 15 to about 25 micrometers.

6. The method of claim 1 wherein the said subsequent layer or layers are opaque.

7. The method of claim 6 wherein said opaque layer or layers is formed of silicon.

8. The method of claim 7 wherein said opaque layer or layers is up to about 12 micrometers in thickness.

9. A method for alignment to an alignment mark array, within a patterned microelectronics layer formed upon a semiconductor substrate, of a subsequent step-and-repeat photomask pattern formed upon an opaque layer formed over the substrate, patterned microelectronics layer and alignment marks, comprising:

providing a semiconductor substrate;

forming upon the substrate a patterned microelectronics layer having therein an array of alignment marks;

forming over the semiconductor substrate, patterned microelectronics layer and alignment mark array a subsequent blanket opaque overlayer;

aligning the alignment mark array to a photomask pattern employing a scanning method further comprising:
scanning the alignment mark array in a first direction employing a step-and-repeat laser scanning system;
changing the orientation of the alignment mark array and scanning direction orthogonally by 90 degrees with respect to the first scanning direction; and
performing subsequent scans with the step-and-repeat laser system to improve the alignment accuracy of the photomask pattern to the alignment mark array.

10. The method of claim 9 wherein the semiconductor substrate is a silicon semiconductor substrate.

11. The method of claim 9 wherein the alignment mark array is a rectilinear array containing at least two rows and at least two columns of alignment mark features.

12. The method of claim 11 wherein the alignment mark array consists of individual features of having typical dimensions of from about 3 micrometers to about 5 micrometers.

13. The method of claim 11 wherein the said rectilinear array is a rectangular or square array of equally spaced alignment mark features of overall dimension to fit within the die space allotted within the photomask pattern for alignment marks.

14. The method of claim 12 wherein the individual features of the alignment mark array are formed in rows and columns whose pitch is from about 15 micrometers to about 25 micrometers.

15. The method of claim 9 wherein the alignment mark array features are formed within the layer to an edge height difference of from about 1000 angstroms to about 1500 angstroms.

16. The method of claim 9 wherein said opaque overlayer or overlayers are formed of epitaxial silicon to a thickness of up to about 12 micrometers.

* * * * *

UNITED STATES PATENT AND TRADEMARK OFFICE
CERTIFICATE OF CORRECTION

PATENT NO.    : 6,468,704 B1
DATED         : October 22, 2002
INVENTOR(S)   : Chi-Hung Liao et al.

It is certified that error appears in the above-identified patent and that said Letters Patent is hereby corrected as shown below:

<u>Title page,</u>
Item [75], delete "Yu Hsi Wang" and replace it with -- Yu-Hsi Wang --.

Signed and Sealed this

Twenty-fifth Day of March, 2003

JAMES E. ROGAN
*Director of the United States Patent and Trademark Office*